Oct. 15, 1968 R. A. GARDENGHI 3,406,352
SOLID STATE HIGH FREQUENCY POWER AMPLIFIER
Filed May 17, 1965
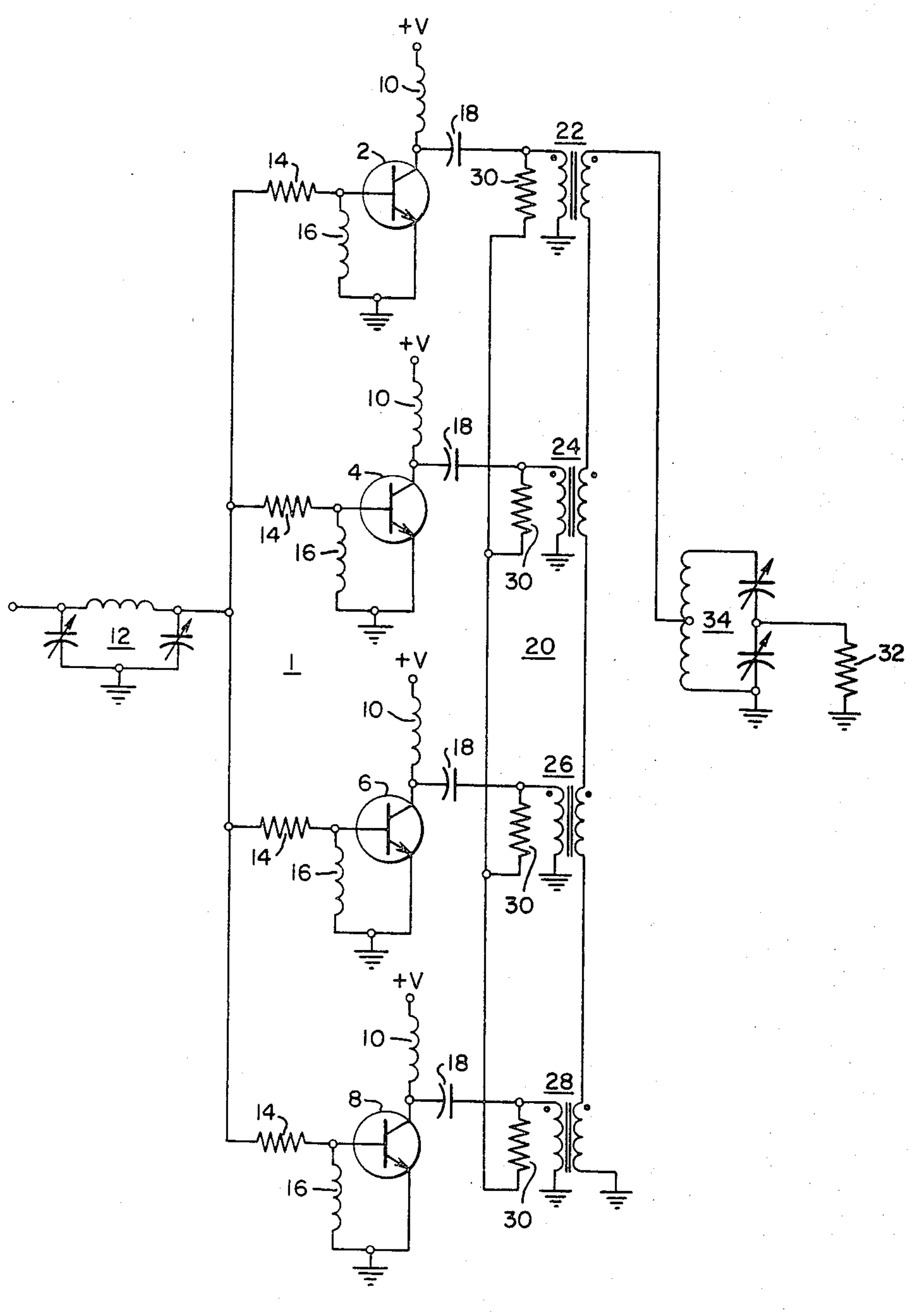
WITNESSES:
Bernard R. Giegucz
Robert C. Baird
INVENTOR
Robert A. Gardenghi
BY Ernest P. Klipfel
ATTORNEY 3,406,352
SOLID STATE HIGH FREQUENCY POWER AMPLIFIER Robert A. Gardenghi, Baltimore, Md., assignor to Westinghouse Electric Corporation, Pittsburgh, Pa., a corporation of Pennsylvania Filed May 17, 1965, Ser. No. 456,228
4 Claims. (Cl. 330—31)

ABSTRACT OF THE DISCLOSURE

A high power solid state amplifier wherein a plurality of semiconductor amplifying devices are combined with a single output tank circuit while maintaining isolation and equal power division between the individual devices. A broadband transformer coupler provides power combining in one direction while reflecting the tank circuit back to the devices in the other direction. By broadbanding the amplifying devices, a common tuned circuit can be placed after the power combiner thereby allowing a single adjustment to control the output circuits of all the amplifying stages.

The present invention relates generally to solid state high frequency power amplifiers and more particularly relates to a power amplifier capable of operation over a broadband of frequencies.

High frequency power amplification can be accomplished by combining the power outputs of a plurality of transistorized amplifier modules, each with tuned input and output circuits.

In conventional circuits, the outputs of several tuned amplifiers are usually summed in a suitable power combining network. Similarly, power dividing networks are used to drive the amplifiers. The problem is that all the amplifiers must be individually tuned to exactly the same frequency and phase relationships. This condition is realizable in a practical sense only when single frequency operation is contemplated. If a range of frequencies is to be tuned, all the individual amplifiers must be synchronously tuned. This is, at best, very difficult to do and involves a great deal of both mechanical and electrical complexity.

An object of the present invention is to provide a high frequency power amplifier capable of broadband operation and which is a simple and practical circuit.

Another object of the present invention is to combine the power outputs of a plurality of transistors independently of the tuned circuits, while maintaining isolation between the transistors with equal power sharings.

Another object of the present invention is to provide a high frequency power amplifier wherein a plurality of transistor amplifier modules can be combined with a single tank circuit while maintaining isolation and equal power distribution between the individual transistors.

Briefly, the present invention accomplishes the above-cited objects and advantages by providing a combination of a plurality of transistor amplifiers combined with a single output tank circuit while maintaining isolation and equal power division between the individual transistors. A broadband transformer coupler provides power combining in one direction while reflecting the tank circuit back to the transistors in the other direction. By broadbanding the transistor amplifiers, a common tuned circuit can be placed after the power combiner thereby allowing a single adjustment to control the output circuits of all the transistor stages.

When desirable, another broadband circuit for power division can be inserted prior to each transistorized amplifier thereby connecting a single common tuned circuit to the input of the apparatus allowing the use of a common input tuning circuit for the plurality of transistor amplifiers.

Further objects and advantages of the present invention will be readily apparent from the following detailed description taken in conjunction with the drawing, in which the sole figure is an electrical schematic diagram of an illustrative embodiment of the present invention.

The high power broadband radio frequency amplifier is illustrated. A plurality of semiconductor amplifiers 1, such as for example, transistors 2, 4, 6 and 8 are connected in parallel with each output or collector electrode connected through an RF choke 10 to a voltage source +V. Each base or input electrode is connected to a common input tank circuit 12 of low power through an isolating resistor 14. Another choke 16 connects each base electrode to ground and is advantageously of the ferrite bead type since it does not present any resonances at any frequency but appears as a resistance to RF and a short circuit to DC. Each common or emitter electrode is connected to ground. A coupling capacitor 18 connects each amplifier to the power combiner circuit 20.

The power combiner circuit 20 combines the outputs of the plurality of parallelly connected transistor amplifiers 1. The bandwidth of the combiner is entirely dependent upon the transformers 22, 24, 26 and 28. These transformers are preferably of the broadband type having, for example, a flat response over a 2 to 30 megacycle range. A bridge of resistors 30 isolate each amplifier from the others by absorbing any unbalance in power. The magnitude of their impedance must be equal to the impedance seen in the primary of the transformers. The resistors 30 provide isolation of the input ports.

Each amplifier module presents a source impedance having a magnitude which ideally should be equalled to the magnitude of resistance of its associated resistor 30. Obviously, the output power from each transistor module should be in phase and of equal amplitude for ideal combining. The manner in which the transformer windings are connected provide isolation at the inputs. If the secondary of the broadband transformers were connected in parallel, a short on any input would result in reflecting a short to all the secondaries. This is prevented by the series circuit combination of the transformer secondaries with the impedance ratio of the transformers selected to reflect the impedance of a utilization device or load 32 at the primary windings. The load is connected to the output side of the power combiner circuit 20 through the output tank circuit 34 of high power capacity.

The transformers may have a turns ratio of $N1/N2=\sqrt{N}$, where N is the number of inputs to insure that each primary sees a resistance equal to the magnitude of impedance connected to the secondary windings. On the other hand, it is not necessary for operation to show the same impedance in the primary as is on the secondary. In fact, one of the advantages of the present invention is that impedance can be changed by suitable selection of N1 and N2. A 1:1 ratio transformer, for example, is easily built and provides a primary impedance equal to the magnitude of impedance connected to the secondaries divided by the number of inputs.

Power amplifiers in accordance with the present invention have been successfully operated at both audio and RF frequencies and each showed good isolation between inputs while providing combining action over a very broad bandwidth as compared to other types of power amplifiers.

For example, a two kilowatt solid state linear amplifier having a broad bandwidth of over 5 octaves is readily attainable through the following representative values:

| | |
|---|---|
| Transistors | Type 3TE130 |
| Load **32** ohms | 50 |
| Resistor: | |
| **30** do | 6 |
| **14** do | 8 |
| Resistance on transformer secondary do | 24 |

One hundred sixty watts at 30 megacycles have been obtained from four type 3TE130 transistors with the transformer ratio being 1:1. The combining techniques are broadband with a useful range of 2 to 30 megacycles without retuning. In addition, because of the isolation between inputs of the combiners, if one of the amplifiers fails, a reduced output level is still present rather than a complete loss of capability. By placing the tuned circuit 34 after the power combiner 20, a single adjustment will control the output circuits of all the transistor stages. The circuit 20 is bilateral providing power combining in one direction while reflecting the tank circuit 34 back to the transistors in the other direction. In this manner, a number of transistors can be combined with a single tank circuit while maintaining isolation and equal power division between the individual transistors.

When desired, a similar circuit 20 can be inserted between the input tank circuit 12 and the amplifier modules 1. A broadband power divider with the secondaries of each of the transformers connected in series circuit combination with the input tank circuit 12 will divide the power from the tank circuit for connection to each of the base electrodes of the transistors through an associated primary winding.

While the present invention has been described with a degree of particularity for the purposes of illustration, it is to be understood that all modifications, alterations and substitutions within the spirit and scope of the invention are herein meant to be included.

I claim as my invention:

1. A high power wideband RF amplifier comprising, in combination; a plurality of semiconductor amplifying devices each including at least an input electrode, an output electrode and a common electrode; a common low power tuned circuit connected to the input electrode of each of said devices; a plurality of broadband transformers each including a primary winding and a secondary winding; each primary winding connected across the output-common electrode circuit of a respective amplifying device; a common high power output tank circuit; each secondary winding connected in series circuit combination with said output tank circuit.

2. The apparatus of the preceding claim wherein each said broadband transformer has a turns ratio of, $$N1/N2=\sqrt{N}$$

where N1 is the number of primary turns, N2 is the number of secondary turns and N is the number of said plurality of semiconductor amplifying devices.

3. A high power wideband RF amplifier comprising, in combination; a plurality of semiconductor amplifying devices each including at least an input electrode, an output electrode and a common electrode; a low power tuned circuit connected to the input electrode of each said amplifying device; a plurality of broadband transformers each including a primary winding and a secondary winding; each primary winding connecting an output electrode of a respective amplifying device to ground; a high power output tuned circuit; a load connected to said output tuned circuit; the secondary windings connected in series circuit combination with said output tuned circuit and having an impedance of predetermined magnitude thereon including said tuned circuit and load; a resistance element for each said primary winding connecting the output electrode of each said amplifying device to a common junction; each said resistance element having a magnitude of impedance substantially equal to said predetermined magnitude of impedance divided by the number of said like plurality of broadband transformers.

4. The apparatus of the preceding claim wherein each said semiconductor amplifying device has a magnitude of resistive impedance substantially equal to the magnitude of impedance of each said resistor element.

References Cited

UNITED STATES PATENTS

| | | | |
|---|---|---|---|
| 2,957,143 | 10/1960 | Enloe | 330—31 XR |
| 3,022,465 | 2/1962 | Slenker et al. | 330—30 |
| 3,327,238 | 6/1967 | Harwood | 330—31 |

ROY LAKE, *Primary Examiner.*

J. B. MULLINS, *Assistant Examiner.*